United States Patent [19]

Franchi et al.

[11] Patent Number: 4,998,112
[45] Date of Patent: Mar. 5, 1991

[54] METHOD FOR MEASURING LARGE ANTENNA ARRAYS

[75] Inventors: Peter R. Franchi, Winchester; Harvey Tobin, Brookline, both of Mass.

[73] Assignee: The United States of America represented by the Secretary of the Airforce, Washington, D.C.

[21] Appl. No.: 400,179

[22] Filed: Aug. 29, 1989

[51] Int. Cl.$^5$ .............................................. H01Q 3/00
[52] U.S. Cl. .................................... 342/360; 343/703
[58] Field of Search ........................ 342/360; 343/703

[56] References Cited

U.S. PATENT DOCUMENTS

| | | | |
|---|---|---|---|
| 3,302,205 | 1/1967 | Johnson | 343/703 |
| 3,378,846 | 4/1968 | Lowenschuss | 343/100 |
| 3,879,733 | 4/1975 | Hansen et al. | 343/100 AP |
| 4,201,987 | 5/1980 | Tricoles et al. | 343/703 |
| 4,553,145 | 11/1985 | Evans | 342/360 |
| 4,811,023 | 3/1989 | Gelernter et al. | 343/703 |

OTHER PUBLICATIONS

Franci et al., Technique To Measure Large Antenna Arrays, 9/23/88, Antennas Symposium.

Primary Examiner—Gregory C. Issing
Attorney, Agent, or Firm—William Stepanishen; Donald J. Singer

[57] ABSTRACT

A method for measuring the far field antenna pattern of a large phased array antenna on a conventional far field range by applying a correction factor to the antenna phase shifters. As the antenna is electronically steered to each of its scan angle, a particular correction factor is applied to each radiating elements to correct the far field antenna pattern to the shortened far field range.

8 Claims, 9 Drawing Sheets

METHOD FOR MEASURING LARGE ANTENNA ARRAYS

STATEMENT OF GOVERNMENT INTEREST

The invention described herein may be manufactured and used by or for the Government for governmental purposes without the payment of any royalty thereon.

BACKGROUND OF THE INVENTION

The measurement of one dimensional planar arrays that are electrically long is currently a difficult task. The accurate measurement of these antenna patterns is limited by the large antenna range requirements for the far field ranges, by the number of near field points that must be measured on a near field range, and by the great size and surface quality requirements of the reflector and feed for compact ranges. This patent application describes the use of applying a quadratic and higher phase correction factors to the phased array and measuring the partially corrected pattern at a distance much shorter than the usual far field distance.

The errors that result from this approach are analyzed as a function of range, the antenna electrical length, the sidelobe level, and the degree of correction which was applied. Both computer simulation and analysis are used to examine the limitations of this approach.

Investigations are currently underway to find methods for mounting large, lightweight, phased arrays on the fuselage of aircraft for airborne surveillance. Such arrays tend to be very long in one dimension, but moderate in size in the other. Because of the physical size of these antennas, the measurement of their basic antenna patterns is very difficult. For example, the far field distance for an antenna with a $10' \times 100'$ aperture at C-Band would be about 23 miles. By the far field range criteria of $R \geq 2D^2/\lambda$ (where R is the distance from the antenna in feet and D is the aperture of the antenna in feet) for a very low sidelobe array, the distance would be much greater if more accuracy in the measurement is desired. The use of compact ranges for an antenna of this size would be extremely impractical. One approach in measuring the far field patterns using a conventional antenna range is based on the fact that in one dimension, the smaller one, the far field range antenna is well within the Fresnel field, but an accurate pattern can only be taken by putting in a phase correction over the aperture. Since the phase correction is only accurate at one angle, repeated corrections are therefore required to obtain a good approximation of the antenna pattern for the far field. In the present invention, the first higher order correction factors are examined, quadratic alone and quadratic and cubic. An analysis of the residual error is given and from that analysis, an estimate of the range of angles over which a particular correction factor gives a small error is found. The range space of angles over which the antenna pattern is measured when $R_o$ is equal to infinity, will determine the required number of resets of the phase shifters to narrow the error factor to an acceptable level.

Thus, it may be seen that at the present time very large phased array antennas cannot be accurately or conveniently measured by present prior art current measurement techniques. The purpose of the present invention is to provide accurate far field antenna pattern measurements using a much smaller range by the application of phase correction to the phased array.

SUMMARY OF THE INVENTION

The present invention provides a method of measuring the far field antenna patterns of very large phased array antennas on the much smaller conventional far field range than would otherwise be required for a large aperture array. A correction factor is added to each radiating element of the antenna to adjust the far field antenna pattern to a shorter range in which the measurements are made. The correction factor which comprises a quadratic and cubic correction term is applied to reduce the residual measurement error to an acceptable level.

It is one object of the present invention, therefore, to provide an improved method for measuring large antenna arrays.

It is another object of the invention to provide an improved method for measuring large antenna arrays to accurately measure the far field antenna patterns of very large antennas.

It is yet another object of the invention to provide an improved method for measuring large antenna arrays on conventional far field ranges.

It is still another object of the invention to provide an improved method for measuring large antenna arrays wherein a correction factor is applied at each antenna scan angle.

It is an even further object of the invention to provide an improved method for measuring large antenna arrays in which the amount of residual measurement error that can be tolerated as acceptable can be predetermined from the dimensions and characteristics of the antenna under test.

These and other advantages, objects and features of the invention will become more apparent after considering the following description taken in conjunction with the illustrative embodiment in the accompanying drawings.

DESCRIPTION OF THE PREFERRED EMBODIMENT

Figure 1:
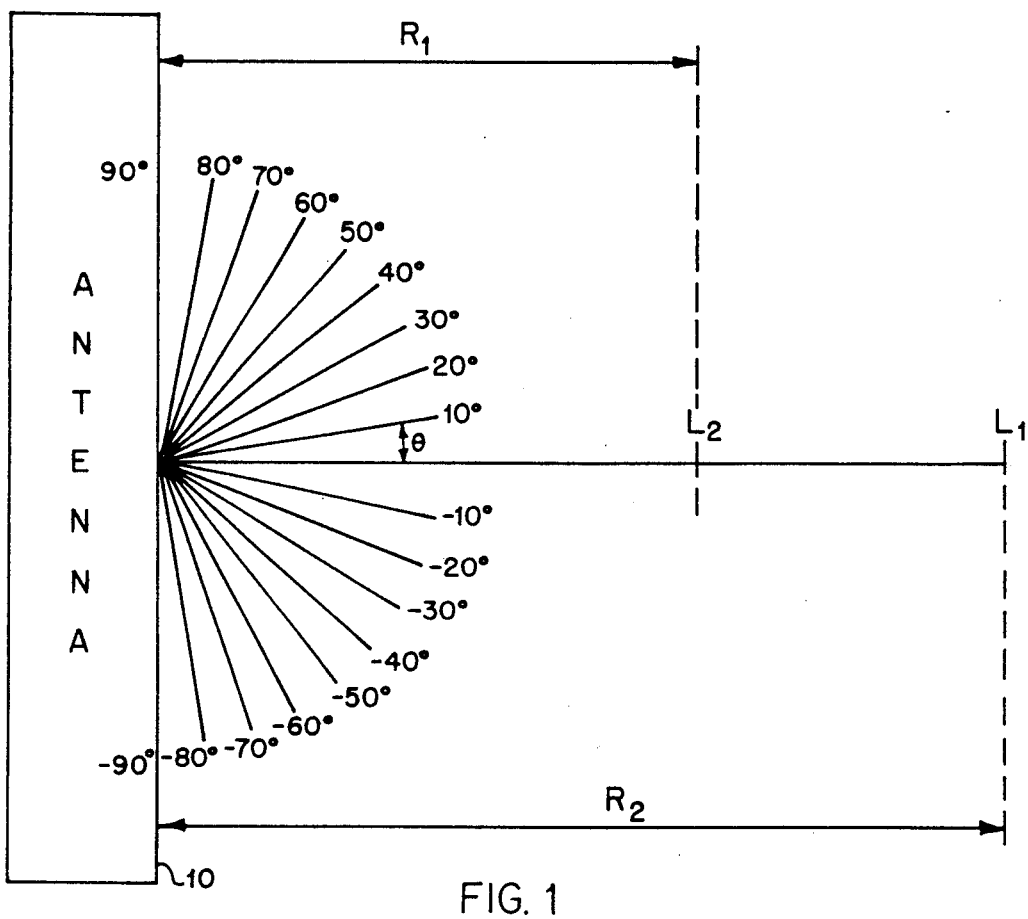
FIG. 1 is a schematic illustration of antenna scan angles and far field parameters.

Referring now to FIG. 1, there is shown a schematic diagram of a transmitting antenna 10 with a very large aperture antenna i.e. 10 ft high by 100 ft long. In order for this antenna 10 to be in the far field, $R_2$ according to the $2D^2/\lambda$ criterion, would be approximately 24 miles away, at $L_1$. The distance $R_1$ represents the minimum distance between the transmitting antenna 10 and the receiver/test equipment (not shown) which would be located at the boundary $L_1$ or beyond. To help reduce the distance down to a practical antenna range size such as is shown by the boundary, $L_2$, a phase correction factor can be applied to each radiating element of the antenna 10. The distance $R_1$ which is dependent upon the size of the antenna range available, the size of antenna, and the frequency of operation, can be determined by using graphs in FIGS. 9 and 10. With this information and FIG. 10, the number of times the phase correction needs to be applied to obtain a particular error factor $\epsilon$, can be determined. It should be noted that the phase correction factor is applied to each radiating element at each particular scan angle which is shown in FIG. 1. Therefore, as the antenna pattern is positioned at each of the other radiating angles, the phase correction factor must be reapplied to each of the radiating elements.

If a conventional far field test range is used to measure the antenna pattern of a very large antenna, there will be pattern distortion in the measurement due to the fact that the wavefront coming into (or going out of) the large array is spherical. By the use of an impressed spherical phase correction factor upon each radiating element of the array, the distortion in the antenna pattern is effectively removed at one specific angle. A different correction factor must be applied at each other angle to which the antenna beam is positioned.

Figure 2:
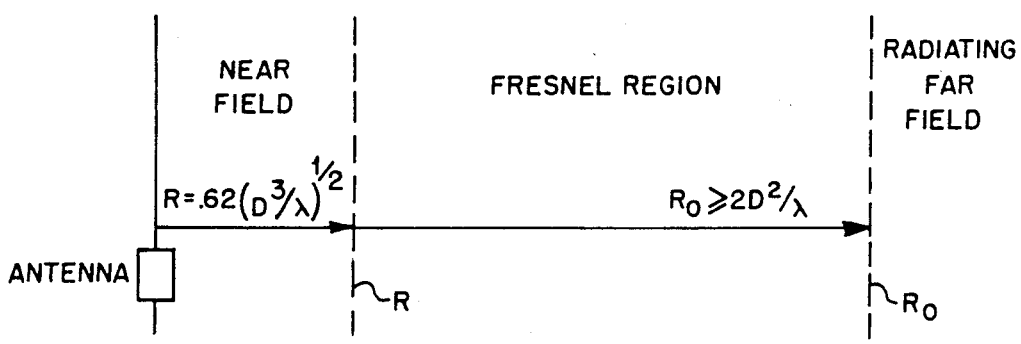
FIG. 2 is a schematic illustration of antenna pattern field regions.

Turning now to FIG. 2, there is shown the regions where the antenna pattern measurements are taken. For conventional far field measurements, the transmitting and receiving antennas must be positioned at a distance greater than $R_o$ which is defined by $2D^2/\lambda$, where D is the diameter in feet of the antenna being tested and $\lambda$ is the wavelength in feet which corresponds to the frequency of the measurement. The techniques described here permit the measurement of large phased array antennas at distances less than the minimum far field range of $2D^2/\lambda$ and greater than the near field distance of $0.62 (D^3/\lambda)^{1/2}$.

There are two types of corrections factors that follow from an analysis of the spherical wave expansion of the far field. They are: the quadratic correction factor, and the quadratic plus the cubic correction factor. For the first correction factor type, a single correction factor is applied to the phase shifter of the individual element of a phased array. This quadratic correction factor reduces the total measurement error in the antenna pattern by a fixed amount leaving a residual measurement error of third or higher order. The quadratic correction factor is applied once to substantially reduce the measured error. The phase correction factor is $$\frac{n\pi\lambda}{2R_o}$$

where n is the number of the nth element from the center of the array, and $R_o$ is defined as the distance between the phased array being tested and the receive antenna. This reduces the residual measurement error to $$\frac{M}{4} \frac{D^3}{\pi R_o^2}$$

Sin $\theta$ Cos$^2\theta$ where $\theta$ is defined as the angle from the beam peak to any arbitrary angle.

If the allowed residual error is too large after the quadratic correction is applied, the cubic correction term may be applied as many times as is necessary to reduce the residual measurement error to the desired or acceptable level. When a lower error level is required, the cubic correction must be applied as many times as necessary to lower the residual error measurement. A correction factor is applied at each finite angular section. The cubic error is $$\frac{KD^3}{8R_o^2} (\cos^2\theta \sin\theta - \cos^2\theta_o \sin\theta_o).$$

There is no cubic error when the arbitrary pattern angle is equal to $\theta_o$, the angle at which the cubic phase correction is made. As $\theta$ approaches the angle $\theta_o$, the error will be at limit acceptable. At this point, the phase shifters are set for a new $\theta_o$. The pattern error decreases until $\theta$ is equal to the new $\theta_o$ and begins to increase again. The number of resettings of the phase shifters is determined by the acceptable measurement added error level (cubic error term), the range $R_o$, diameter of the antennas D and the wave number k.

Figure 3:
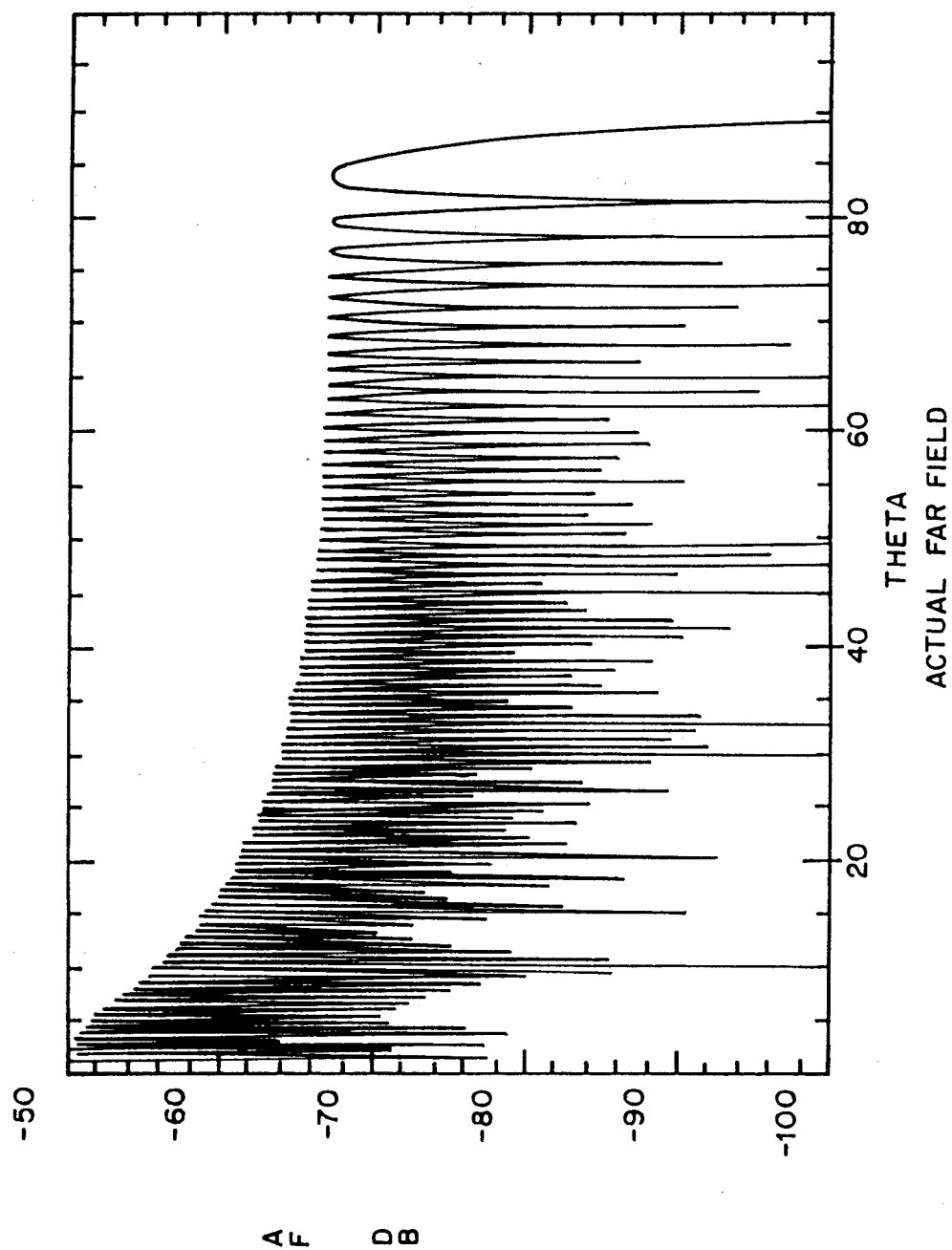
FIG. 3 is a graphical representation of the actual far field antenna pattern for a 192 element array antenna.
Figure 4:
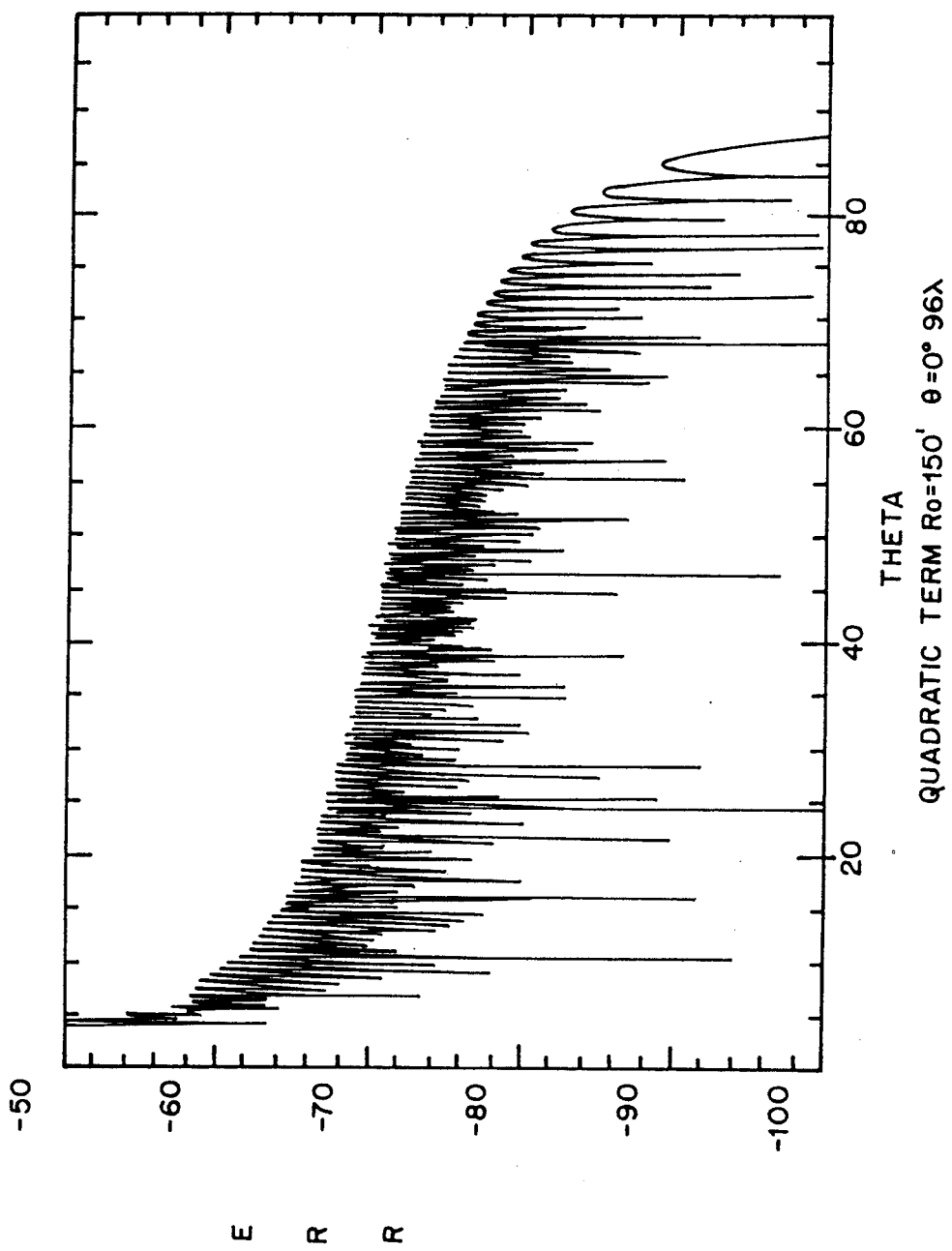
FIG. 4 is a graphical representation of a corrected antenna pattern which includes the quadratic correction factor.
Figure 5:
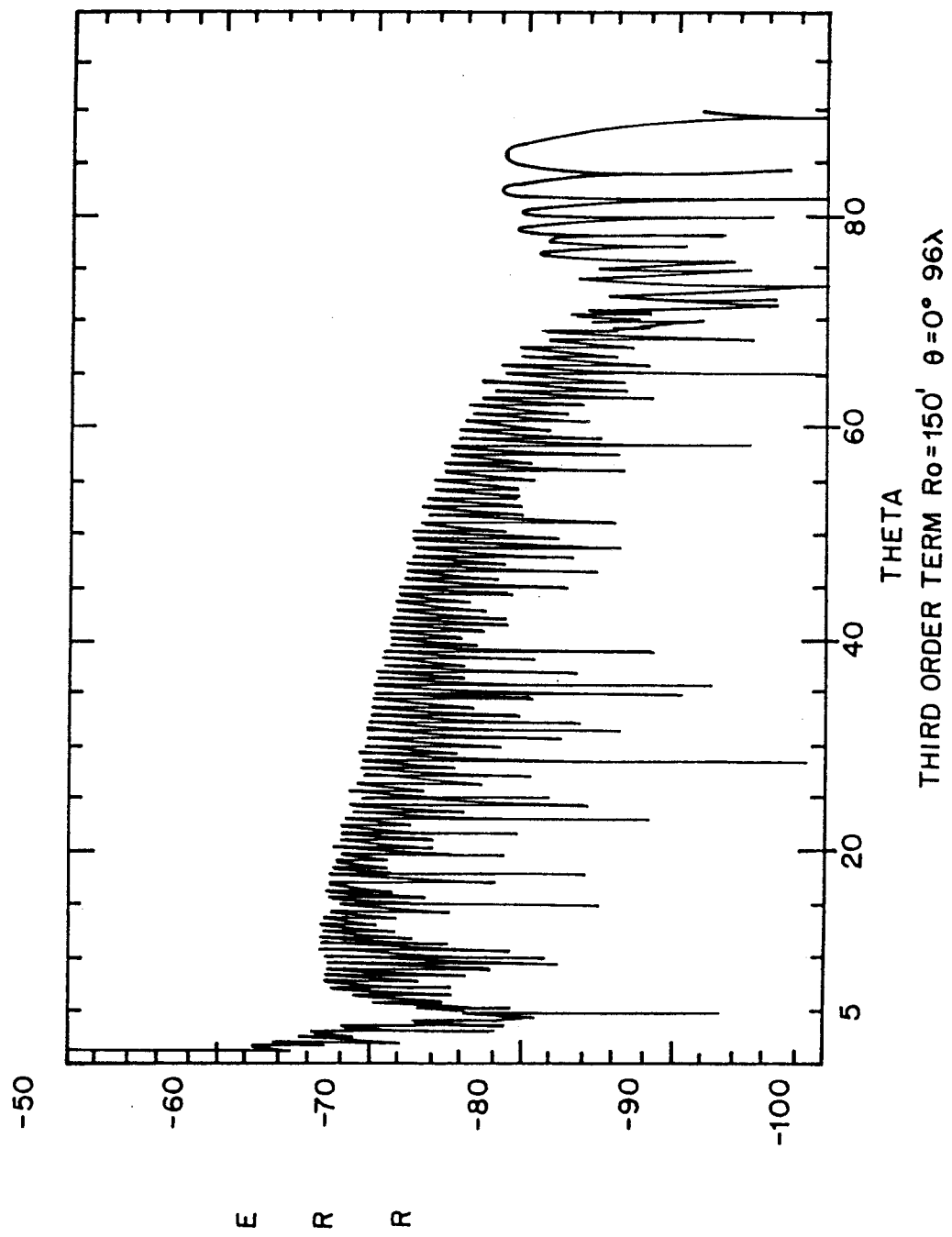
FIGS. 5 through 8 are graphical representations of corrected antenna patterns which include the third order correction factor at selected scan angles.
Figure 6:
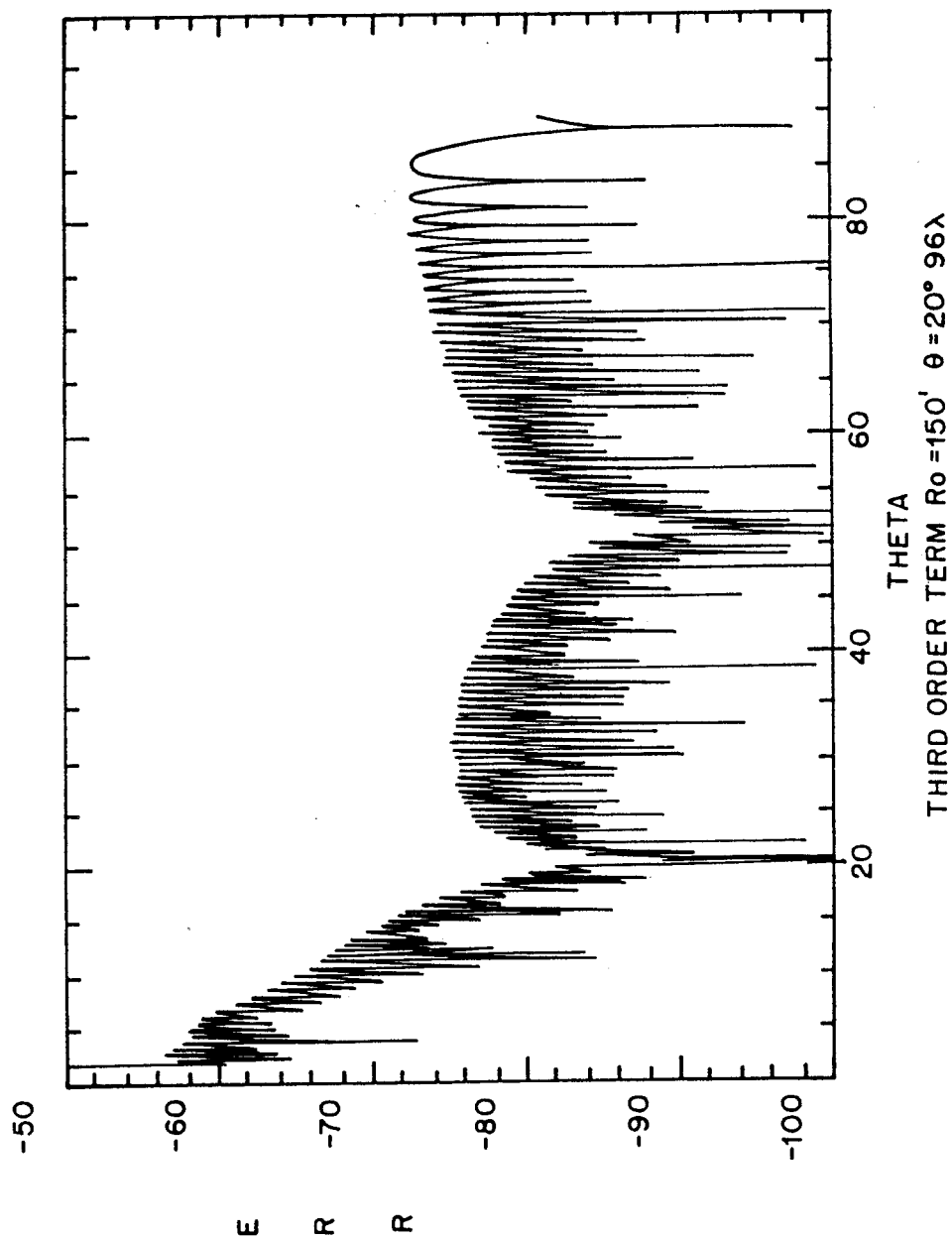
Figure 7:
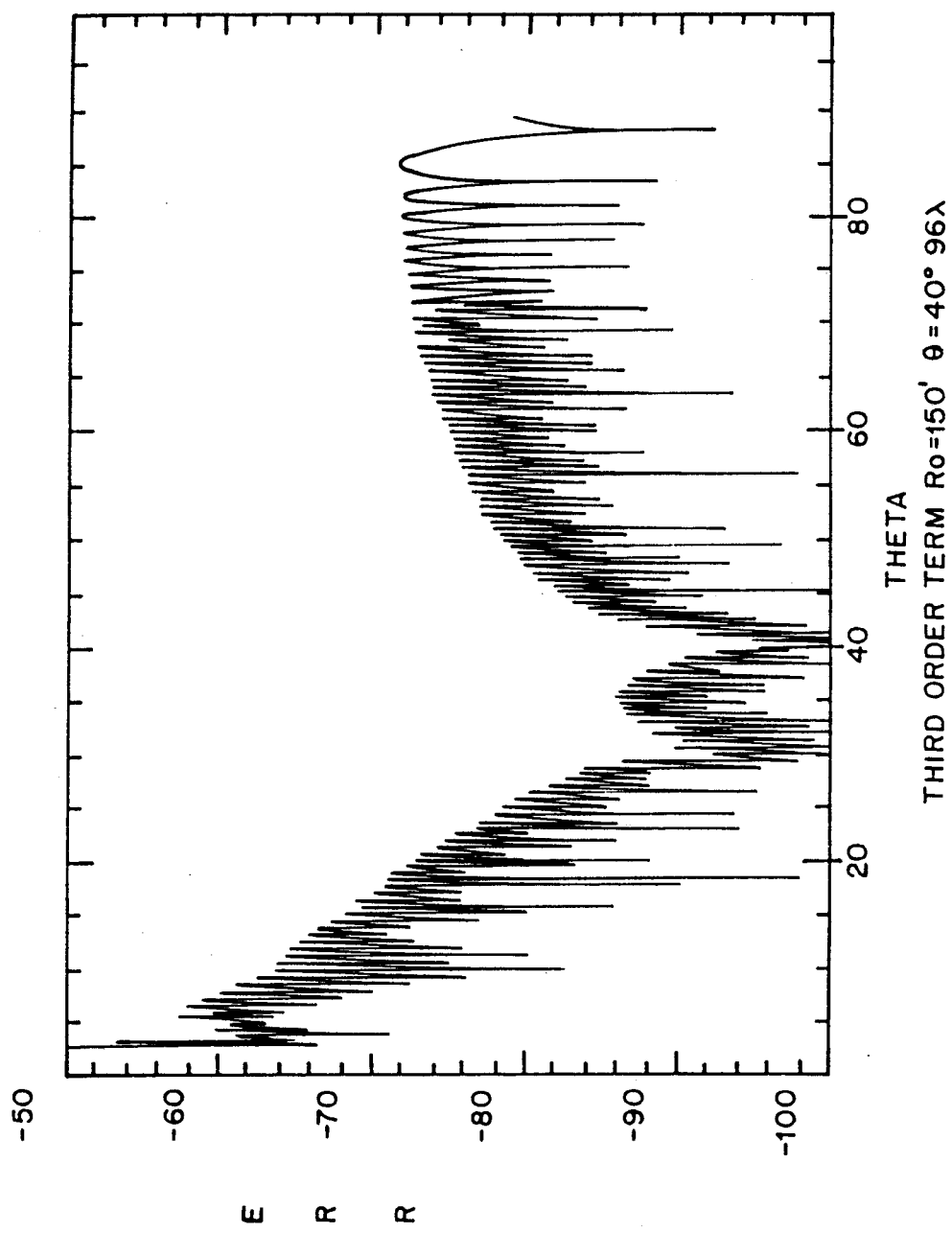
Figure 8:
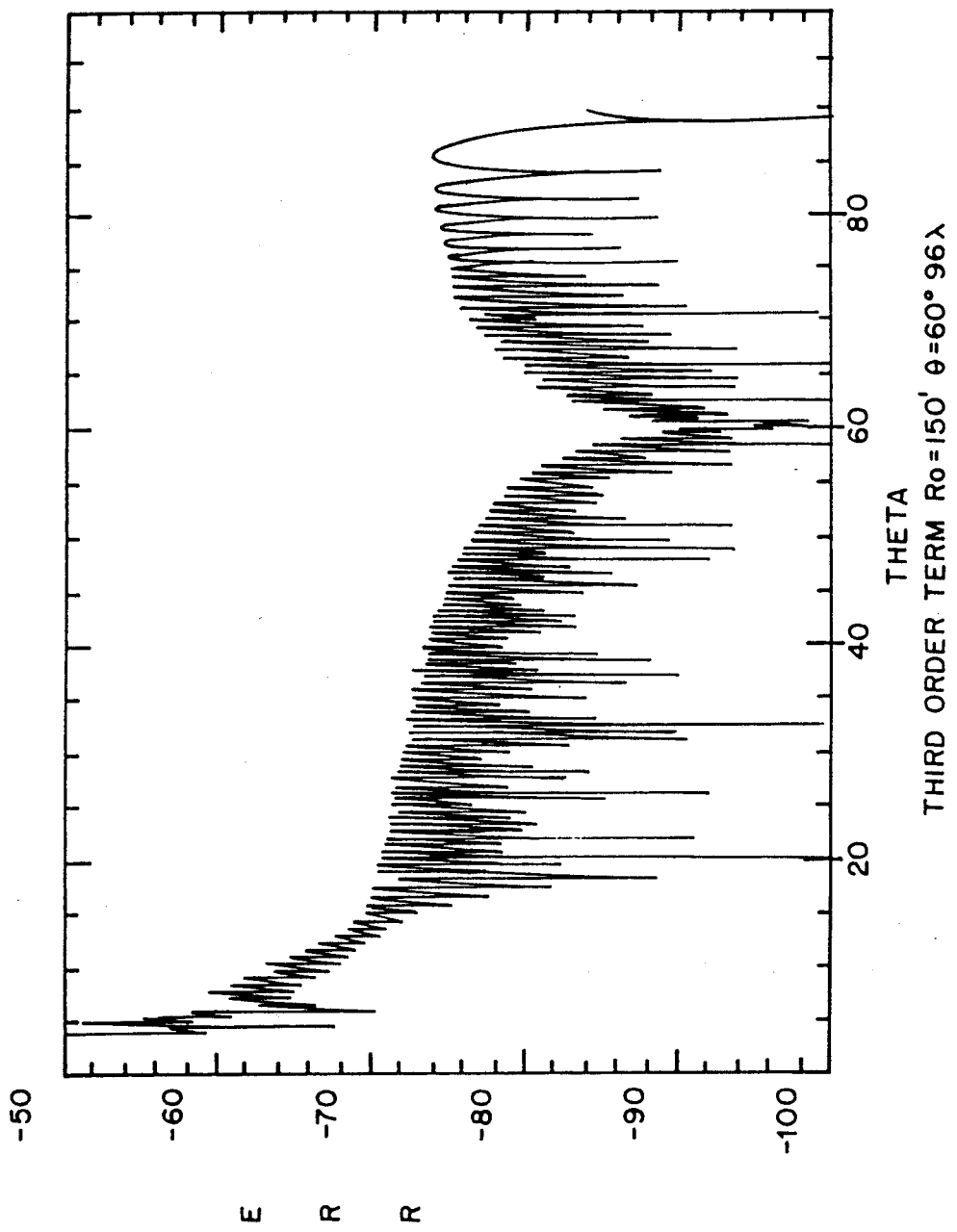

In order to show how this technique operates the following examples from simulations are given. There is shown in FIG. 3 the far field antenna pattern of a 50 db Taylor illumination for a 192 element array antenna. In FIG. 4 there is shown the residual error after the quadratic error has been removed. The antenna array is 16 feet long with 2″ wavelength and the distance to the transmitting horn is 150 feet. The difference between the correct far field pattern and the corrected pattern with quadratic correction factor is shown in FIG. 4. The error is about 12 db down giving an add on error of 0.3 db. By adding the third order correction factor, the measurement added error is reduced still further as is shown by FIG. 5. An example is given in FIG. 6 with the third order correction factor applied at 20 degrees. There is a deep reduction of about 50 db at 20 degrees with a corresponding reduction at about 51 degrees. This is consistent with the error terms $$\epsilon = \frac{K}{8} \frac{D^3}{R_o^2} (\sin\theta \cos^2\theta - \sin\theta \cos^2\theta_o)$$

which has the same two null locations. In FIG. 7, there is shown the results of setting $\theta_o$ to 40° and in FIG. 8, $\theta_o$ in the third order (cubic) correction factor has been set to 40°.

Figure 9:
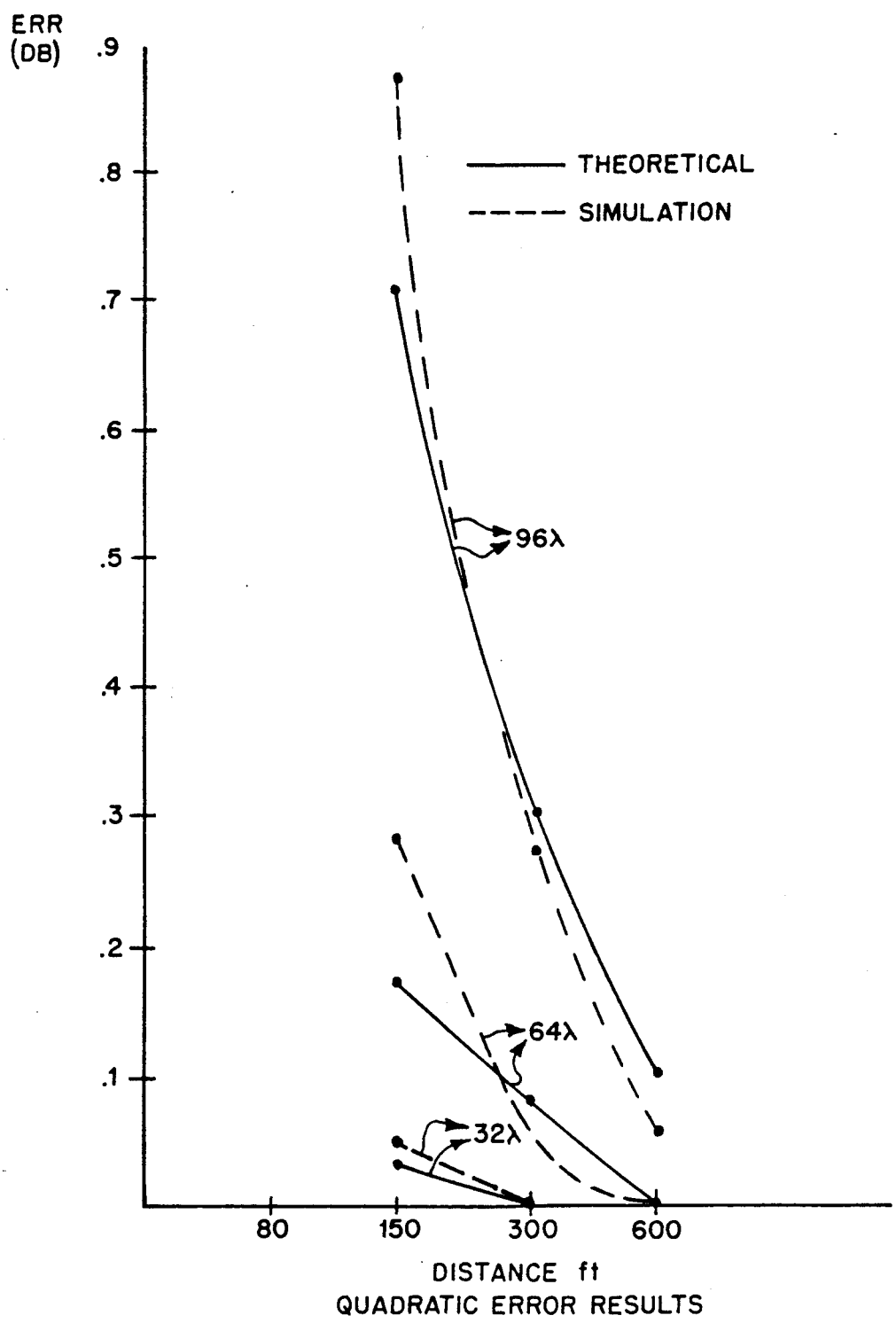
FIG. 9 is a graphical representation of the quadratic correction error versus the distance between the transmitting and receiving antennas.
Figure 10:
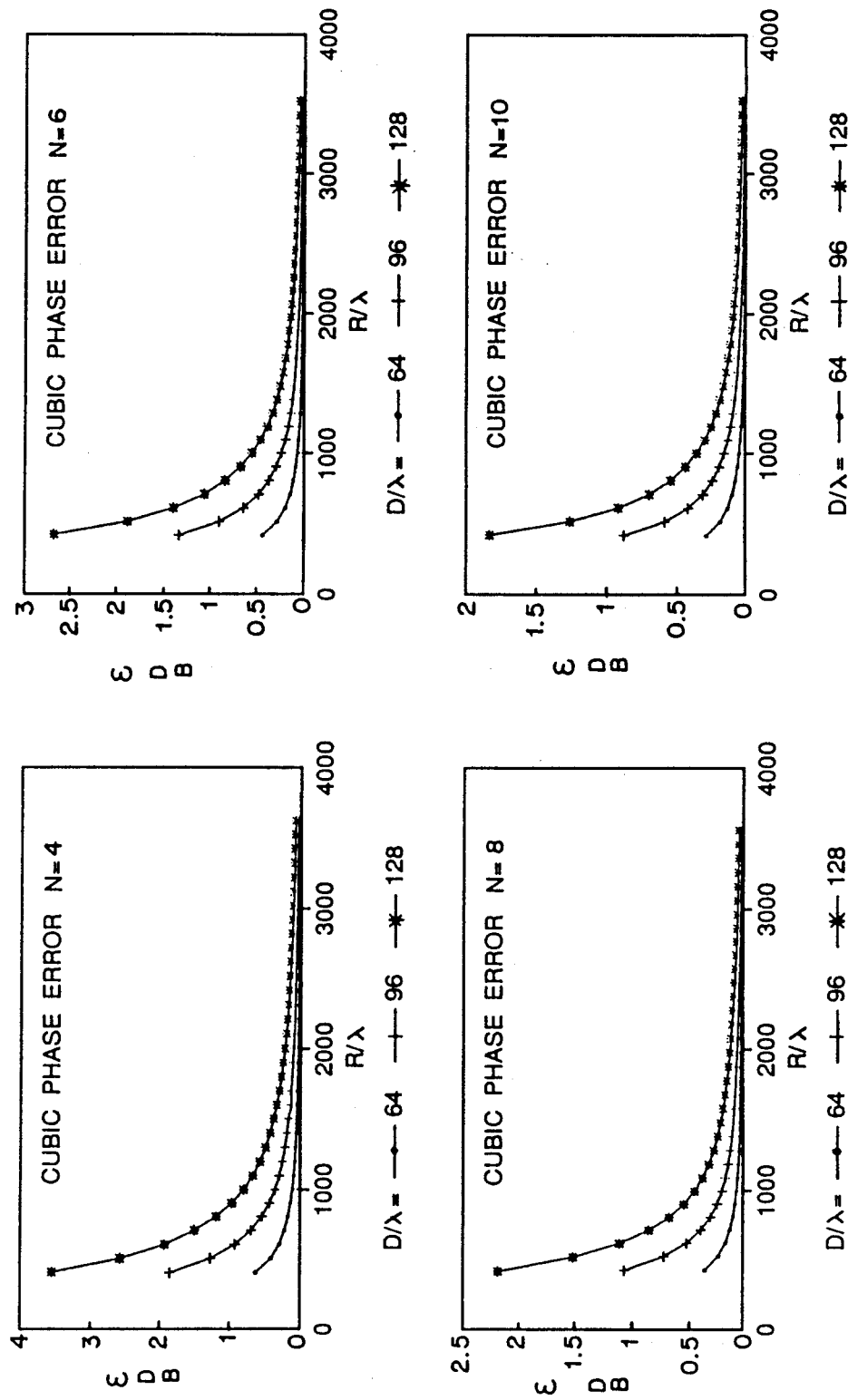
FIGS. 10 a–d are graphical representations of the cubic correction error versus phase shifter for typical antenna size.

Finally, the additional measurement error, as a function of the range distance R and the antenna size D, is shown in FIGS. 9 and 10 for different phase settings in the phase shifter. All the curves are derived from the error equation. These error estimates are all for the case when the errors are small and the sidelobes are primarily the deterministic (theoretical) sidelobes. When the error sidelobes dominate, quadratic correction only (the error results are shown in FIG. 9) is sufficient but (like the cubic correction (the error results are shown in FIG. 10) for deterministic sidelobes) it must be applied N times to reduce the added measurement error, $\epsilon$ to the desired level.

For the analysis a computer simulation was developed. This involved writing three individual computer programs. The first program generates the actual far field pattern, and the result is shown in FIG. 3. Using the generated actual far field pattern as a reference, a second program was written using a modified expression which includes the correction factors. First the program was run including only the quadratic correction. This was performed for several different cases in which the distance $R_o$ was varied. The program was then run including the third order correction and as with the quadratic correction the parameters $R_o$ and $\theta_o$ were varied. To determine the degree of difference between the actual far field pattern and the pattern which include the correction terms another simulation was run. This program subtracts the actual far field values. This gives a measure of the error in adding the correction terms.

The results of the simulation for the quadratic term correction factor alone are presented in FIG. 4. These results are for a 96λ antenna. For the addition of the third order correction factor at various $\theta_o$ settings, the results are shown in FIGS. 5 through 8.

With the results of the computer runs a set of graphs have been developed. These graphs are a measure of how much error one can expect in applying this technique to a design. In FIG. 9, there is shown a comparison of the resultant error versus distance between the antennas for the case in which the quadratic correction factor alone was applied. FIG. 9 shows how the error will vary with distance in applying the quadratic correction alone.

In FIG. 10 there is shown the effect of adding the third order correction. The graph represents how many times the phase shifter will have to be set in order to achieve a certain error margin.

The use of the phase correction method permits residual error measurements in the Fresnel field region. The quadratic and cubic correction factors have been derived in the following manner. However, several assumptions must be made to derive the dominant error forms. These assumptions include:
(1) The 1/R amplitude term can be approximated by $1/R_o$, that the Fresnel distance chosen is large enough so that only the phase term contributes significantly to the residual error.
(2) The type of patterns that concern us are low sidelobe patterns with Taylor illuminations or similar and beyond a small angular range these patterns have sin x/x behavior.
(3) The quadratic phase error at the aperture edge is less than a radian.

The actual distance from the Fresnel field point to a point on the aperture is R. Since the array is in the near field in one dimension only, the aperture can be treated as a linear array.

$$R = (R_o^2 + x - 2xR \cos\alpha)^{\frac{1}{2}} \tag{1}$$

where R is the distance from the near field point to the center of the array and x is the distance from the center of the array to any point on the array. For $R_o > x$.

$$R = R_o + \frac{x^2 - 2xR_o \cos\alpha \, R_o}{2R_o^2} - \frac{1 \, (x^2 - 2xR_o \cos\alpha)^2 R_o}{8R_o^4} + \tag{2}$$

$$\frac{1 \, (x^2 - 2xR_o \cos\alpha)^3 R_o}{12R_o^6} \quad \frac{-5 \, (x^2 - 2xR_o \cos\alpha)^4 R_o}{128 \, R_o^8} + \text{etc}$$

after combining terms $$R = R_o - x\cos\alpha + x^2\left(1/2R_o - \frac{\cos^2\theta}{2R_o}\right) + \tag{3}$$

$$x^3(1/2R_o^2\cos\theta - 1/2R_o^2\cos^3) - x^4(1/8R_o^3 -$$

$$12/16 \cos^2\theta/R_o + 80/128 \cos^4\theta/R_o^3 + \cdots$$

Let $\theta = 90 - \alpha$ $$R = R_o - x\sin\theta + x^2/2R_o\cos^2\theta + x^3 2R_o \sin\theta\cos^2\theta - 31$$
$$x^4/8R_o^3(\cos^2\theta(1-5\sin^2)) \tag{4}$$

The Fresnel field expression E(u) can be written as:

$$E(u) = k' \int_{-1/2}^{1/2} \frac{F(x') e^{jkR}}{R} dx' \tag{5}$$

$$\simeq \frac{k'}{R_o} \int_{-1/2}^{1/2} F(x') e^{jkR} dx' \tag{6}$$

With $$X' = \frac{D}{2} x$$

and $$u = \frac{kD}{2} \sin\theta \quad \text{For The Linear Term}$$

$$\beta = \frac{k\cos^2\theta \, D^2}{8R_o} \quad \text{For The Quadratic Term}$$

$$\gamma = \frac{kD^3}{6R_o^2} \sin\theta \, \cos^2\theta \quad \text{For the Cubic Term}$$

and, $$\alpha = \frac{kD^4}{128R_o^3} \cos^2\theta(1 - 5\sin^2\theta) \quad \text{For The Fourth Order Term}$$

$$E(u) = k \int_{-1}^{1} F(x) e^{j(ux - \beta x^2 - \gamma x^3 + x^4 + \cdots)} dx \tag{7}$$

equation 7 can be approximated by $$E(u) = k \int_{-1}^{1} F(x) e^{j(ux - \beta x^2 - \gamma x^3)} dx \tag{8}$$

The actual far field Pattern is $E_o(u)$ where, $$E_o(u) = k \int_{-1}^{1} F(x) e^{jux} dx = g_o(u) \tag{9}$$

Since $R_o$ is chosen so the $\beta x^2$ and the $\gamma x^3$ terms are less than 1 then, $$E(u) \simeq k \int_{-1}^{1} F(x) e^{jux}(1 - j\beta x^2 - j\gamma x^3) dx \tag{10}$$

-continued $$E(u) \approx k \int_{-1}^{1} F(x) e^{jax} dx - j\beta k \int_{-1}^{1} F(x) x^2 e^{jux} dx - j\gamma k \int_{-1}^{1} F(x) x^3 e^{jux} dx$$

$$= g_o(u) - j\beta k \int_{-1}^{1} F(x) x^2 e^{jux} dx - j\gamma k \int_{-1}^{1} F(x) x^3 e^{jux} dx$$

Since, $$\int_{-1}^{1} x^m F(x) e^{jux} dx = \frac{1}{(j)^m} \frac{d^m}{du^m} \int_{-1}^{1} F(x) e^{jux} dx$$

$$= g_o(u) + j\beta g_o^{(2)}(u) - j\gamma g_o^{(3)}(u)$$

where $g^{(m)}(u)$ represents the derivative to the $m^{th}$ power. The corresponding power pattern is $P(u) = E(u) E^*(u)$ then, $$P(u) = [g_o(u) - 31 \gamma G_o^{(3)}(u)]^2 + \beta^2 [G_o^{(2)}(u)]^2 + \text{higher order terms}$$

$$g_o^{(2)}(u) + Y^2(g_o^{(3)}(u))^2 - 2Y g_o^{(3)}(u) + \beta^2 (g_o^{(2)}(u))^2$$

+ higher order terms.

Using the assumption that the far field Taylor or a similar far field pattern beyond a small angle can be approximated by, $$g_o(u) = \frac{a \sin(u)}{u} + \frac{bf(u)}{u^2} + \frac{cf(u)}{u^3}$$

where $u = k \sin\theta$; b, c, are constants; and $f(u)$ is a simple trigonometric function. Therefore as u gets large then, $$g_o(u) \approx \frac{a \sin(u)}{u}$$

$$g_o^{(2)}(u) = a\left[\frac{-\sin(u)}{u} - \frac{2\cos(u)}{u^2} + \frac{2\sin(u)}{u^3}\right]$$

$$g_o^{(3)}(u) = a\left[-\frac{\cos(u)}{u} + \frac{3\sin(u)}{u^2} + \frac{6\sin(u)}{u^3} - \frac{6\sin(u)}{u^4}\right]$$

The absolute error term is given by, $$\epsilon(u) \approx |P_o(u) - P(u)|$$

where $P_o(u) = |g_o(u)|^2$ then the absolute error is expressed as $$\epsilon(u) = a^2\left[(\sin^2(u))\left(\frac{8\beta^2}{u^4} + \frac{6\gamma}{u^3} + \frac{3\beta\gamma}{u^2} + \ldots\right) + \cos^2(u)\left(\frac{4\beta^2}{u^4} + \frac{\beta^2\gamma}{u^2} + \ldots\right) + \sin(u) \cos^2(u)\left(\frac{-2\gamma}{u^2} + \ldots\right)\right]$$

The major error terms are, $$\frac{a^2 8\beta^2}{u^4}, \frac{a^2 4\beta^2}{u^4}, \frac{-a^2 2\gamma}{u^2}$$

If quadratic phase error is removed, the $$\frac{-a^2 2\gamma}{u^2}$$

becomes the dominant term.

$$\beta' = \beta - \frac{kD^2}{8R_o}$$

$$\beta' = \frac{kD^2}{8R_o}(\cos^2\theta - 1) = -\frac{kD^2}{8R_o}\sin^2\theta$$

Without quadratic phase correction the dominant error term is proportional to $\cos^2\theta$ so the distortion is greatest at $\theta = 0$. With the correction this error term becomes proportional to $\sin^2\theta$ and so is very small near $\theta = 0$. As might be expected, this change results in the evaluation of the Y term as the dominant error. Examination of this expression gives the resulting error as a function of the array size, measurement distance and wavelength. This error is $$\epsilon(u) \approx \frac{2a^2\gamma}{u^2}$$

and is the absolute resulting error. The normalized error or percentage error is $\epsilon_o$ and is defined by, $$\epsilon_0(u) \approx \frac{\epsilon(u)}{|g_o(u)|^2} \approx 2\gamma$$

or, $$\epsilon_o(u) = \frac{kD^3}{8R_o^2}\sin\theta \cos^2\theta$$

$$= \frac{\pi D^3}{4\lambda R_o^2}\sin\theta \cos^2\theta$$

This expression gives the residual error. If $\epsilon$ is also the acceptable error which is allowed by this measurement technique, the minimum range for use of quadratic phase correction only is $$R \geq \left(\frac{.3D^3}{\lambda\epsilon_o}\right)^{\frac{1}{2}}$$

For example, if the maximum added error is 0.1 db (0.023) and $\lambda$ is 0.16", the $R \leq 30D^{3/2}$

| D | R | $2D^2/\lambda$ |
|---|---|---|
| 8' | 680' | 9850' |
| 16' | 1920' | 39,390' |
| 32' | 5430' | 157,500' |

If this range is too great, the error can be reduced by applying the cubic phase correction factor several times. This reduces the error around a limited angular range. The normalized error is then, $$\epsilon(u) = \pi/4 \frac{D^3}{\lambda R^2} (\sin\theta \cos^2\theta - \sin\theta_o \cos^2\theta_o)$$

With an approximate angular sector of 10° in the antenna pattern and the third order correction factor, the separation between the transmitter and the receiver can be reduced by a factor of 8.

| D | R (cubic correction) | R (with quadratic only) |
|---|---|---|
| 8' | 85' | 680' |
| 16' | 240' | 1920' |
| 32' | 680' | 5430' |

Over the full angular coverage of 180°, the phase correction factor must be applied on the order of 9 times since the correction factor is double valued.

The use of the quadratic correction factor and, when necessary third order phase correction factor, permits the accurate measurement of the far field pattern of very large phased arrays at ranges much less than the normal far field distance. This measurement technique applies only to arrays in which one dimension is much greater than the other and F only when the statistical sidelobe behavior, not the exact, (with any particular phase shifter setting) is required.

Although the invention has been described with reference to a particular embodiment, it will be understood to those skilled in the art that the invention is capable of a variety of alternative embodiments within the spirit and scope of the appended claims.

What is claimed is:

1. A method for measuring the antenna patterns of large antenna arrays at a distance that is shorter than the calculated far field distances which comprises:
   (a) applying a signal to each radiating element of a plurality of radiating elements of said large antenna array,
   (b) adjusting the relative phase difference between adjacent radiating elements in said plurality of radiating element to position the antenna beam at one of a predetermined number of scan angles,
   (c) applying a correction factor to each radiating element to affect the beam characteristics of the transmitted antenna pattern,
   (d) measuring said transmitted antenna pattern at a range which is substantially shorter than the calculated far field distance,
   (e) determining the residual error in said transmitted antenna pattern, and
   (f) repeating steps a-e to determine the residual error in each transmitted antenna pattern at each angle of said predetermined number of angles.

2. A method of measuring antenna patterns as described in claim 1 wherein said correction factor comprises a quadratic correction factor.

3. A method of measuring antenna patterns as described in claim 1 wherein said correction factor comprises a quadratic correction factor and a third order correction factor.

4. A method of measuring antenna patterns as described in claim 1 wherein step (c) is repeated a calculated number of times to achieve a predetermined error level.

5. A method of measuring antenna patterns as described in claim 1 wherein said predetermined number of scan angles are spaced every 10 degrees from 90 degrees to 180 degrees.

6. A method of measuring antenna patterns as described in claim 2 wherein said third order correction factor is repeated a predetermined number of times to achieve a calculated error level.

7. A method of measuring antenna patterns as described in claim 2 wherein said quadratic correction factor is defined by:

$$\beta = \frac{k \cos^2\theta D^2}{8R_o}, \text{ where } k \text{ is the wave}$$

number, $R_o$ is the range, D is the diameter of the antenna, and $\theta$ is the scan angle.

8. A method of measuring antenna patterns as described in claim 3 wherein said third order correction factor is defined by:

$$\gamma = \frac{k D^3}{16R_o} \sin\theta \cos^2\theta,$$

where K is the wave number, $R_o$ is the range, D is the diameter of the antenna, and $\theta$ is the scan angle.

* * * * *